United States Patent

Evans, Jr. et al.

[11] Patent Number: 5,164,808
[45] Date of Patent: Nov. 17, 1992

[54] PLATINUM ELECTRODE STRUCTURE FOR USE IN CONJUNCTION WITH FERROELECTRIC MATERIALS

[75] Inventors: Joseph T. Evans, Jr.; Jeff A. Bullington; Carl E. Montross, Jr., all of Albuquerque, N. Mex.

[73] Assignee: Radiant Technologies, Albuquerque, N. Mex.

[21] Appl. No.: 738,897

[22] Filed: Aug. 9, 1991

[51] Int. Cl.$^5$ ............................................. H01L 29/66
[52] U.S. Cl. ..................................... 361/305; 365/65; 365/145; 365/149; 361/321; 257/295; 257/769
[58] Field of Search ...................... 357/25, 26, 27, 51, 357/55; 365/145, 149, 65; 361/303, 305, 311, 312, 313, 321, 322

[56] References Cited

U.S. PATENT DOCUMENTS

| | | | |
|---|---|---|---|
| 3,623,030 | 11/1971 | Sawyer | 357/15 |
| 4,517,486 | 5/1985 | Andrews | 310/311 |
| 4,831,432 | 5/1989 | Hori et al. | 357/67 |
| 4,895,812 | 1/1990 | Wang et al. | 437/187 |
| 5,003,428 | 3/1991 | Shepherd | 361/321 |
| 5,005,102 | 4/1991 | Larson | 357/51 |
| 5,031,144 | 7/1991 | Persky | 357/23.6 |
| 5,046,043 | 9/1991 | Miller et al. | 357/23.6 |
| 5,053,917 | 10/1991 | Miyasaka et al. | 361/321 |
| 5,070,026 | 12/1991 | Greenwald et al. | 437/915 |

FOREIGN PATENT DOCUMENTS

| | | | |
|---|---|---|---|
| 0-350941 | 1/1990 | European Pat. Off. | 310/311 |
| 2-198094 | 8/1990 | Japan | 365/145 |

Primary Examiner—Rolf Hille
Assistant Examiner—Minhloan Tran
Attorney, Agent, or Firm—McCubbrey, Bartls, Meyer & Ward

[57] ABSTRACT

An improved ferroelectric structure and the method for making the same is disclosed. The improved structure reduces the fatigue problems encountered in ferroelectric capacitors while providing avoiding problems in depositing the ferroelectric material which have prevented other solutions to the fatigue problem from being effective. The improved ferroelectric structure also provides improved adhesion to the underlying substrate. The ferroelectric structure has a bottom electrode comprising a layer of $PtO_2$ which is generated by depositing a layer of Platinum on a suitable substrate and then exposing the Platinum layer to an Oxygen plasma. The ferroelectric material is then deposited on the $PtO_2$ layer.

3 Claims, 1 Drawing Sheet

PLATINUM ELECTRODE STRUCTURE FOR USE IN CONJUNCTION WITH FERROELECTRIC MATERIALS

FIELD OF THE INVENTION

The present invention relates to ferroelectric structures, and more particularly, to ferroelectric capacitors and methods for making the same.

BACKGROUND OF THE INVENTION

Ferroelectric based capacitors offer potential advantages in integrated circuit design. Many integrated circuits incorporate capacitors. For example, DRAM memory cells store a binary value by storing charge on a small capacitor. These capacitors consist of two conductors separated by a dielectric material such as silicon dioxide. The capacitance of the capacitor determines the length of time between refresh cycles. As circuit designers improve these circuits by reducing the size of the components on the silicon substrate, the size of the capacitors is also reduced. As a result, the capacitance of the capacitor is also reduced. The decrease in capacitance requires the DRAM cells to be refreshed more often. There is some minimum retention period below which refresh cycles are inoperative; hence, it would be advantageous to provide a capacitor which is small in size while providing greater capacitance than those currently constructed utilizing silicon compounds as the dielectric.

Ferroelectric materials having very high dielectric constants are known to the art. Lead lanthium zirconate titanates (PLZT) having dielectric constants in excess of 500 have been demonstrated. Hence, such materials could provide significant improvements in integrated circuit capacitors. Unfortunately, attempts to utilize ferroelectric capacitors in integrated circuits have suffered from a number of problems.

A ferroelectric capacitor typically comprises two conductors which sandwich a layer of ferroelectric material. The capacitor is constructed in three steps. First, the bottom conductor is deposited on the integrated circuit substrate. Next, the ferroelectric material is deposited as a thin film on top of the first conductor. The deposition requires processing temperatures in excess of 600° C. Third, the top electrode is deposited on the ferroelectric layer. Fifth, connections must be made to the top and bottom electrodes. The connections to the bottom electrode must be accomplished with the aid of a via hole.

If the top and bottom electrodes are constructed from metallic layers such as metallic gold or platinum and the ferroelectric material is PLZT, the resultant capacitor exhibits an aging effect. The Pt/PLZT interface forms a diode-like junction due to a large band gap work function difference between the interface of the metal and ceramic. This interface has a tendency to trap charges which can not make it over the diode barrier or across the ceramic layer to balance out the charge in the ceramic at the metal interface. This trapped charge induces fatigue which limits the lifetime of the capacitor.

It has been suggested that these aging effects can be reduced by the use of ohmic contacts such as the metallic oxides. For example, Indium Tin Oxide or Ruthenium Oxide for the top and bottom electrodes have been suggested. The ohmic contacts reduce the Schottky barrier in the ferroelectric ceramic. However, to construct a capacitor with metallic oxides for both electrodes requires that the PLZT ceramic be deposited on the metallic oxide in question. Unfortunately, it is difficult to obtain satisfactory deposition of the PLZT material on a bottom electrode constructed from these oxides. Without proper crystallization of the PLZT, the resulting capacitor will leak sufficient charge to render it unsatisfactory for most uses.

Yet another problem with the construction of ferroelectric capacitors is the adhesion of the bottom electrode to the integrated substrate during the ferroelectric deposition steps. As noted above, the ferroelectric deposition steps require temperatures in excess of 600° C. The thermal expansion and contraction during these processing steps often leads to separation of the bottom electrode from the semiconductor substrate when metallic platinum electrodes are used.

Broadly, it is the object of the present invention to provide an improved electrode/PLZT structure which provides the benefits of an ohmic contract while allowing satisfactory deposition of the PLZT material on the electrode during the fabrication of the device.

It is a further object of the present invention to provide a bottom electrode that is more resistant to separation from the underlying substrate during PLZT deposition.

These and other objects of the present invention will become apparent to those skilled in the art from the following detailed description of the present invention and the accompanying drawings.

SUMMARY OF THE INVENTION

Figure 1:
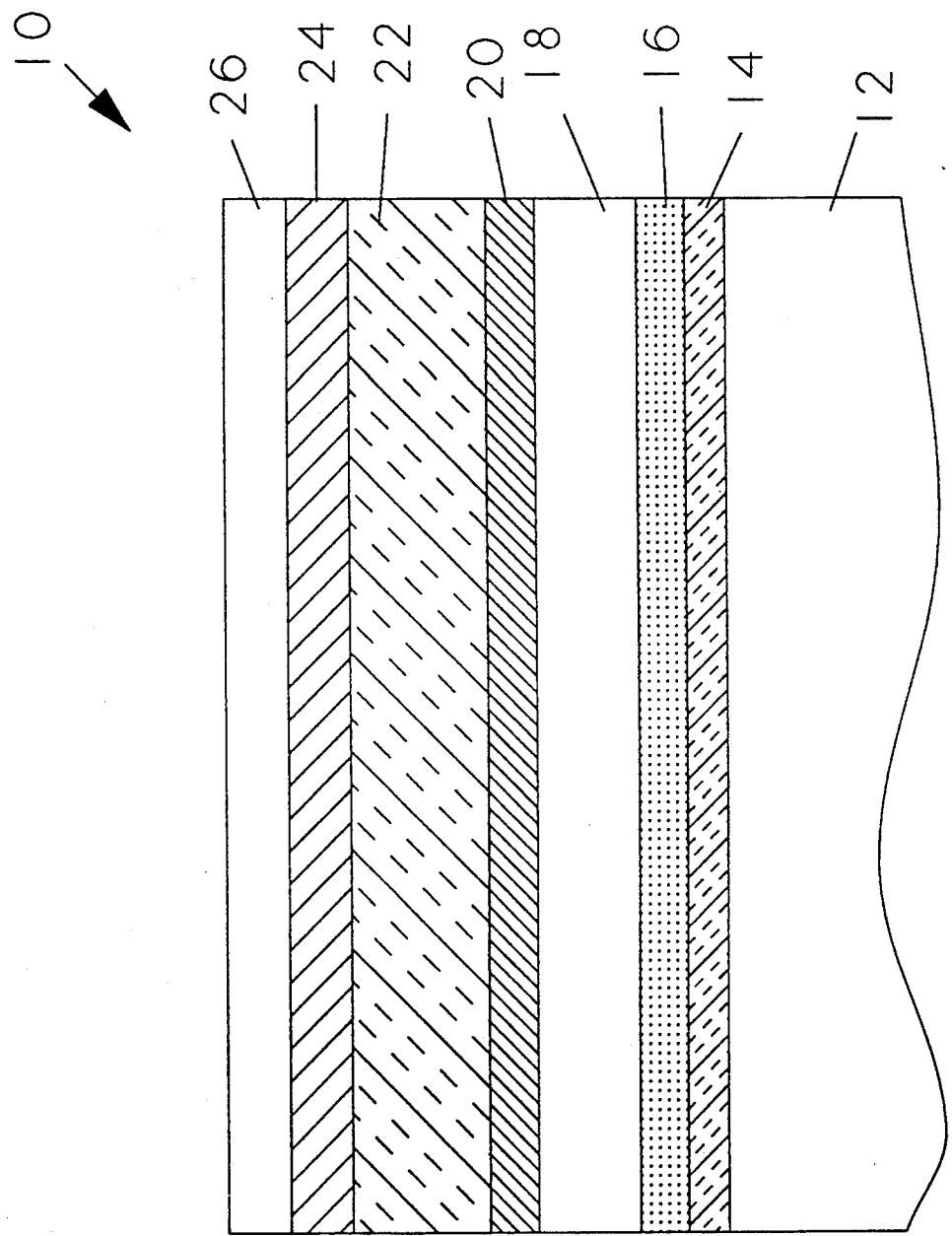
FIG. 1 is a cross-sectional view of a ferroelectric capacitor according to the present invention.

The present invention comprises an improved ferroelectric structure and the method for making the same. The ferroelectric structure has a bottom electrode comprising a layer of $PtO_2$ which is generated by depositing a layer of Platinum on a suitable substrate and then exposing the Platinum layer to an Oxygen plasma. The ferroelectric material is then deposited on the $PtO_2$ layer.

DETAILED DESCRIPTION OF THE INVENTION

The present invention will be described with reference to the construction a ferroelectric capacitor; however, it will be apparent to those skilled in the art that the invention may be utilized in other situations in which PLZT is to be deposited on an ohmic contact. The present invention is based on observation that $PtO_2$ provides the advantages of a metallic oxide in terms of avoiding the Schottky barrier effects described above while providing a surface on which PLZT may deposited without encountering the problems that prevented other metallic oxides from acting as a deposition layer. In addition, it is found experimentally that the $PtO_2$ layer has adhesion properties that are superior to those of other metallic oxides at the temperatures normally encountered in PLZT deposition.

FIG. 1 is a cross-section of a PLZT capacitor 10 according to the present invention. Capacitor 10 is fabricated on a silicon substrate 12 which has a protective layer 14 of silicon dioxide thereon. The $SiO_2$ layer is preferably about $1\mu$ in thickness. A layer 16 of Titanium having a thickness of approximately 0.1 m is applied to the SiO$_2$ layer to act as an adhesive. The use of a Titanium or Tantalum layer as a "glue" to bond Platinum to SiO$_2$ is well known in the semiconductor arts, and hence, will not be described further.

A Platinum bottom electrode 18 is then deposited on layer 16 by DC Sputtering or E-Beam evaporation. Electrode 18 is preferably 0.2 m in thickness. At this point, the layers are patterned and etched in hot Aqua Regia.

A PtO$_2$ layer 20 having a thickness of approximately 0.01 m is then generated on the surface of electrode 18 by ashing the surface of layer 20. That is, the surface of layer 20 was exposed to an oxygen plasma for at least 10 minutes at a power of approximately 150 mW and a pressure of approximately 200 mTorr. In one embodiment of the present invention, a Techniques Plasma Etcher Model 750 was utilized for the ashing step. The PtO$_2$ acts as buffer/passivation layer creating a fully conductive inert oxide interface.

The ferroelectric material is then deposited as a layer 22 on the PtO$_2$ layer 20. PLZT compositions are preferred for the ferroelectric material; however, other ferroelectric materials may also be utilized. The ferroelectric may be deposited by sol-gel, sputtering, or CVD. These deposition techniques are well known to those skilled in the art, and hence, will not be discussed further here. The thickness of PLZT layer 22 will depend on the desired capacitance and the other physical dimensions of PLZT layer 22. In one embodiment of the present invention, PLZT layer 22 is 0.3μ in thickness. It has been found experimentally the PtO$_2$ layer provides a base for the deposition and crystallization which has properties similar to metallic Pt while providing the electrical advantages of a metallic oxide. In addition, it is found experimentally that the Pt/PtO$_2$ layer has superior surface adhesion properties to those of a Pt layer lacking the oxide layer.

The top electrode 24 of capacitor 10 may be constructed from any fully conductive oxide layer including but not limited to Indium Tin Oxide (ITO) and Ruthenium Oxide. The preferred top electrode is an ITO of at least 0.01μ which has been covered by a Platinum layer 26. This structure may be patterned by a lift-off process using AZ Photoresist 1542.

A glass layer may then be deposited over the structure and vias opened to expose the Platinum of layer 26. The surface of the exposed portion of Platinum layer 26 is oxidized as described above to form a layer of PtO2 which acts as a buffer for conventional Aluminum metalization.

While the above embodiment of the present invention has been described with reference to PLZT as the ferroelectric material, it will be apparent to those skilled in the art that other materials may be used. For example, Bismuth Titanate may deposited on the PtO$_2$ layer via laser ablation. The deposition of Bismuth Titanate is known to those skilled in the art, and hence, will not be discussed in detail here. The details of such deposition can be found in Ramesh, et al., "Epitaxial Growth of Ferroelectric Bismuth Titanate Thin Films by Pulsed Laser Deposition", Appl. Phys. Lett. 57, pp 1505–1507.

An improved ferroelectric/metallic oxide structure has been described. Various modifications to the present invention will become apparent to those skilled in the art from the foregoing description and accompanying drawing. Accordingly, the present invention is to be limited solely by the scope of the following claims.

What is claimed is:

1. An improved ferroelectric/electrode structure comprising:
   a platinum layer having top and bottom surfaces;
   a layer of PtO$_2$ having top and bottom surfaces, said bottom surface of said PtO$_2$ layer being bonded to said top surface of said Platinum layer; and
   a layer of ferroelectric material having top and bottom surfaces, said bottom surface of said ferroelectric material being bonded to said top surface of said PtO$_2$ layer.

2. The structure of claim 1 wherein said ferroelectric material is PLZT.

3. The structure of claim 1 wherein said ferroelectric material is Bismuth Titanate.

* * * * *